US006503817B1

United States Patent
Yu

(10) Patent No.: US 6,503,817 B1
(45) Date of Patent: *Jan. 7, 2003

(54) METHOD FOR ESTABLISHING DOPANT PROFILE TO SUPPRESS SILICIDATION RETARDATION EFFECT IN CMOS PROCESS

(75) Inventor: Bin Yu, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

(21) Appl. No.: 09/405,519

(22) Filed: Sep. 23, 1999

(51) Int. Cl.[7] ................ H01L 21/425; H01L 21/265; H01L 21/42; H01L 21/26

(52) U.S. Cl. ................ 438/514; 438/519; 438/522; 438/523; 438/525; 438/529

(58) Field of Search ................ 438/514, 515, 438/519, 529, 522, 523, 525

(56) References Cited

U.S. PATENT DOCUMENTS

| 4,456,489 A | * | 6/1984 | Wu ................ 148/1.5 |
| 4,875,086 A | * | 10/1989 | Malhi et al. ................ 357/54 |
| 4,933,994 A | * | 6/1990 | Orban ................ 437/44 |
| 5,547,894 A | * | 8/1996 | Mandelman ................ 437/56 |
| 5,766,695 A | * | 6/1998 | Nguyen et al. ................ 427/553 |
| 5,972,728 A | * | 10/1999 | Chen et al. ................ 438/18 |
| 6,057,215 A | * | 5/2000 | Kitano ................ 438/533 |

* cited by examiner

Primary Examiner—Olik Chaudhuri
Assistant Examiner—Shrinivas H. Rao
(74) Attorney, Agent, or Firm—LaRiviere, Grubman & Payne, LLP

(57) ABSTRACT

A method for suppressing silicidation retardation effects caused by high dopant concentrations, in particular high Arsenic concentrations, at the surface of a semiconductor substrate. The method includes implanting a preamorphization substance into the substrate to define the boundary of the source/drain, then implanting the dopant at high energy to establish a dopant concentration peak that is distanced from the surface of the substrate. The dopant is activated by rapid thermal annealing, with the relatively deep dopant concentration peak facilitating subsequent improved formation of silicide on the surface of the substrate.

9 Claims, 2 Drawing Sheets

METHOD FOR ESTABLISHING DOPANT PROFILE TO SUPPRESS SILICIDATION RETARDATION EFFECT IN CMOS PROCESS

RELATED APPLICATION

This continued prosecution application claims priority benefit of copending U.S. Nonprovisional patent application Ser. No. 09/405,519, entitled "METHOD FOR ESTABLISHING DOPANT PROFILE TO SUPPRESS SILICIDATION RETARDATION EFFECT IN CMOS PROCESS," filed Sep. 23, 1999.

TECHNICAL FIELD

The present invention relates generally to semiconductor fabrication, and more particularly to methods for fabricating improved large scale integration CMOS semiconductor devices.

BACKGROUND OF THE INVENTION

Semiconductor chips are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate and separated therefrom by a gate insulator. Source and drain regions are then formed in the substrate beneath the gate by implanting appropriate dopant materials into the areas of the substrate that are to become the source and drain regions. This generally-described structure cooperates to function as a transistor.

To promote the proper functioning of the transistor by establishing an electrical contact point to, a source or drain of a transistor, a layer of silicide such as Titanium disilicide ($TiSi_2$) is formed on the substrate adjacent the gate. As recognized by the present invention, however, it can be difficult to form the silicide on heavily doped regions, particularly in N-channel transistors that use Arsenic as the dopant. Indeed, silicide formation is retarded on regions that have been heavily doped with Arsenic, degrading circuit speed vis-a-vis transistors that have properly formed silicides. The present invention recognizes the above problem and provides the solutions noted herein.

BRIEF SUMMARY OF THE INVENTION

A method is disclosed for making a semiconductor device, particularly but not limited to an N-channel metal oxide silicon field effect transistor (MOSFET). The method includes implanting a dopant into a substrate having a surface to establish a dopant implant profile defining a peak. In accordance with the present invention, the peak is distanced from the surface. The dopant is then activated.

In a preferred embodiment, to establish a dopant concentration profile having a peak distanced from the surface of the substrate, the dopant is implanted using an implant energy of at least ten thousand electron volts (10 KeV). Moreover, to define an active region lower boundary, a preamorphization substance is implanted into the substrate prior to activating the dopant. The preferred method includes activating the dopant using relatively low temperature rapid thermal annealing, i.e., a temperature of no more than six hundred fifty degrees Celsius (650° C.), to confine the activated region to be between the surface of the substrate and the active region lower boundary. With the relatively deep dopant concentration peak, a silicide can be established on the surface of the substrate with silicide retardation effects being suppressed.

In another aspect, a semiconductor device includes a substrate defining a surface, and an activated region in the substrate the activated region includes Arsenic implanted to a predetermined depth in the substrate, with the Arsenic defining a concentration profile from the surface to the predetermined depth. In accordance with present principles, the profile has a peak that is spaced from the surface of the substrate.

In still another aspect, a method for making a CMOS device includes providing a substrate defining a surface, and implanting a dopant into the substrate such that the highest concentration of dopant is spaced from the surface. The method also includes establishing a silicide on the surface. As disclosed in further detail below, the establishing act is promoted by the spacing of the highest concentration of dopant from the surface.

Other features of the present invention are disclosed or apparent in the section entitled "DETAILED DESCRIPTION OF THE INVENTION".

DETAILED DESCRIPTION OF THE INVENTION

Figure 1:
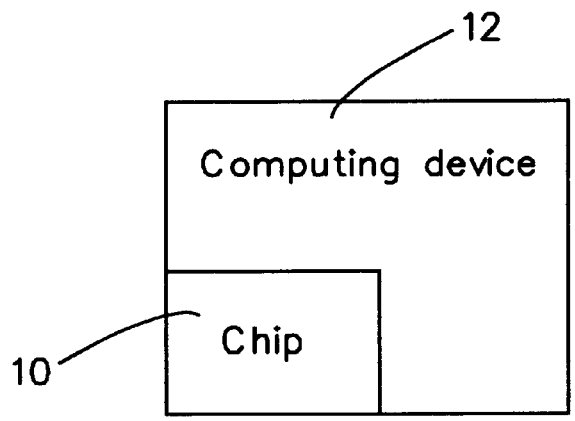
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
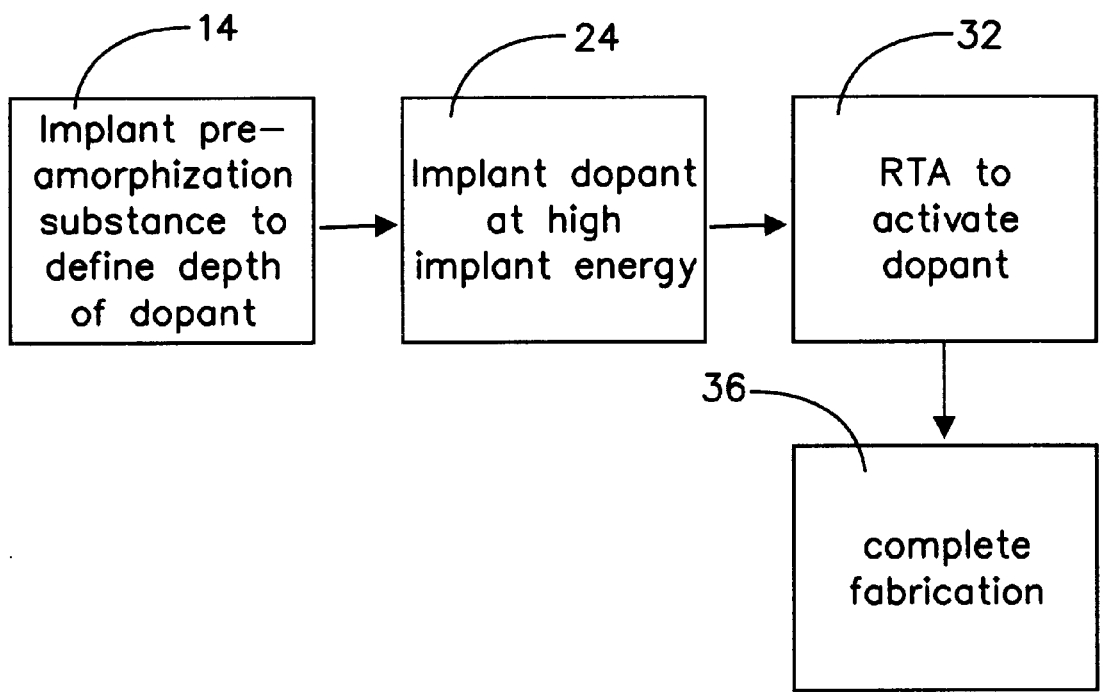
FIG. 2 is a flow chart showing the steps of the present invention.
Figure 3:
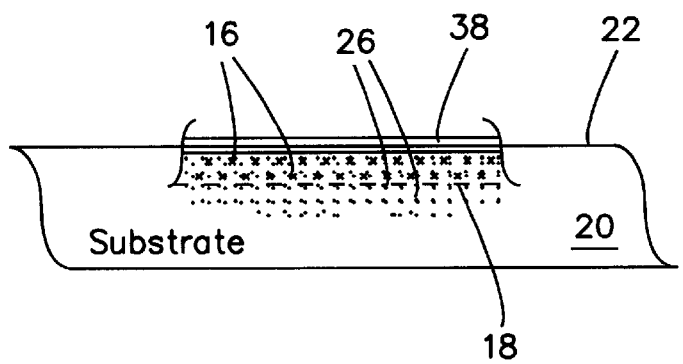
FIG. 3 is a schematic side view of the device.

Now referring to FIGS. 2 and 3, as indicated at block 14 in FIG. 2 and as shown in FIG. 3, a preamorphization substance 16 is implanted down to an intended active region lower boundary 18 in a semiconductor substrate 20 defining a surface 22. The preamorphization substance 16 can be ionic Silicon or Germanium ($Si^+$ or $Ge^+$). It is to be understood that the depth of the intended active region lower boundary 18 from the surface 22 is established to be the desired source/drain contact junction depth.

Moving to block 24, the appropriate source/drain dopant 26 is implanted into the substrate 20. In the context of N-channel MOSFETs, the dopant 26 can be Arsenic. In accordance with the present invention, the dopant 26 is implanted at relatively high implant energies, e.g., at least ten thousand electron volts (10 KeV), more preferably fifteen thousand electron volts 15 KeV), and more preferably still at an energy of twenty thousand electron volts (20 KeV).

Figure 4:
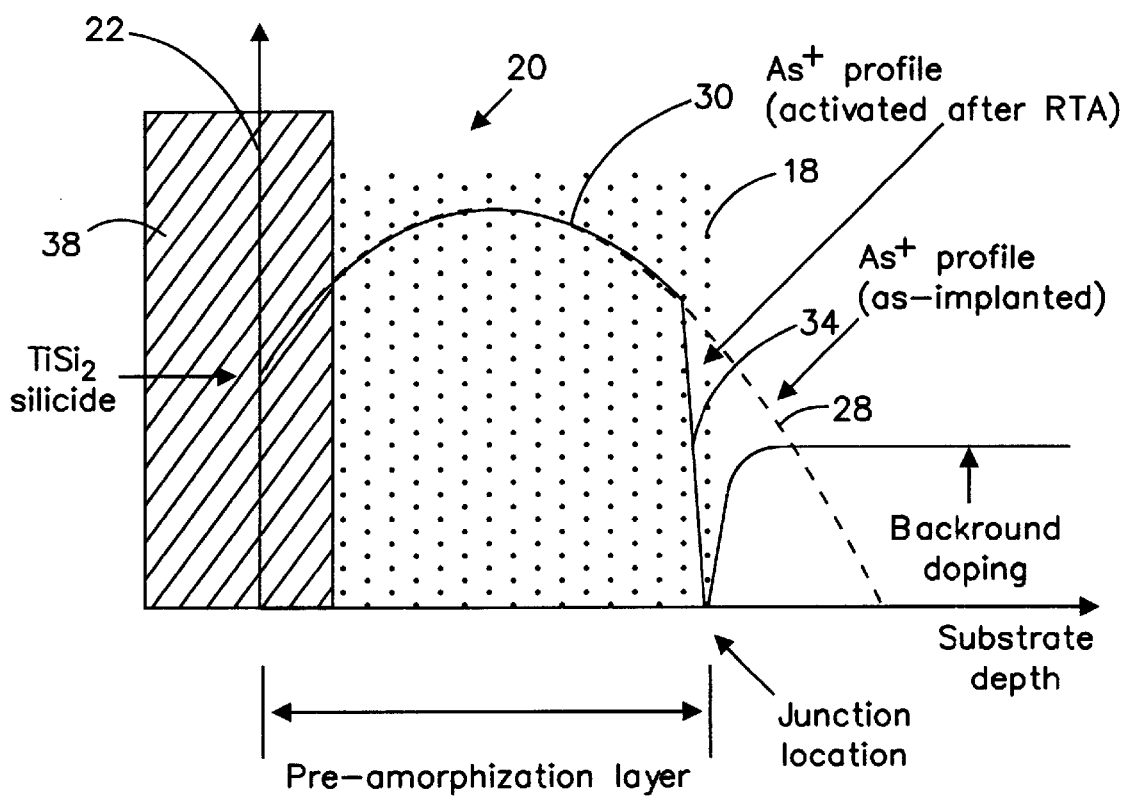
FIG. 4 is a graph showing the dopant profile for suppressing silicidation retardation effects.

As shown in FIG. 3 and as can best be appreciated in reference to FIG. 4, when the dopant is implanted at the above-disclosed energies, prior to annealing the profile of the dopant concentration from the surface 22 of the substrate 20 into the substrate 20 is shown by the dashed line 28. As indicated in FIG. 4, the dopant 26 concentration reaches a peak at a location 30 that is distanced from the surface 22 of the substrate 20 by about two hundred Angstroms to four hundred Angstroms (200 Å–400 Å), in contrast to conventional dopant concentration profiles, wherein the concentration of the dopant is highest at the surface of the substrate. As also shown in FIG. 4, the dopant 26 is implanted, albeit at progressively lower concentrations, deeper than the intended active region lower boundary 18.

After implanting the dopant 26, the dopant 26 is activated at block 32 by, e.g., rapid thermal annealing (RTA) at relatively low temperatures of between, e g., five hundred fifty degrees Celsius and six hundred fifty degrees Celsius (550° C. –650° C.). At these temperatures, the dopant 26 in the region defined by the preamorphization implant 16, i.e., the dopant 26 from the surface 22 of the substrate 20 to the intended active region lower boundary 18, is activated during the recrystallization of the preamorphization implant 16. In contrast, dopant 26 deeper than the intended active region lower boundary 18 is not activated.

FIG. 4 shows the dopant profile after activation at line 34. Accordingly, it may now be appreciated that the dopant profile rendered by the present invention and shown in FIG. 4 achieves a desired conventional source/drain junction depth, i.e., no deeper than the intended active region lower boundary 18, while suppressing subsequent silicidation retardation effects by shifting, the dopant peak concentration to a location 30 that is distanced from the surface 22 of the substrate 20.

After dopant activation, the process moves to block 36 to complete fabrication, including the formation of a silicide layer 38 on the substrate. 20. In. the preferred embodiment, the silicide layer 38 is made; of Titanium disilicide (TiSi$_2$).

While the particular METHOD FOR ESTABLISHING DOPANT PROFILE TO SUPPRESS SILICIDATION RETARDATION EFFECT IN CMOS PROCESS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method for making a semiconductor device, comprising:

implanting a dopant into a substrate having a surface, wherein the dopant is implanted directly into the surface of the substrate by passing the dopant through only the semiconductor substrate, the dopant being implanted in an energy of about 10 KeV–20 KeV, to establish a dopant implant profile defining a peak, the peak being about 200 Å to 400 Å from the substrate surface;

implanting a preamorphization substance into the substrate to define an active region lower boundary, prior to activating the dopant;

activating the dopant by RTA at a temperature between about 550° C. to 650° C.; and forming a silicide on the surface of the substrate.

2. A method, as recited in claim 1, wherein the dopant is Arsenic.

3. A method, as recited in claim 2, wherein the silicide is Titanium disilicide (TiSi$_2$).

4. A method, as recited in claim 3, wherein the preamorphization substance is a material consisting essentially of ionic Silicon or ionic Germanium.

5. A method for making a CMOS device, comprising:

implanting a dopant into a substrate having a surface, wherein the dopant is implanted directly into the surface of the substrate by passing the dopant through only the semiconductor substrate, the dopant being implanted in an energy of about 10 KeV–20 KeV, to establish a dopant implant profile defining a peak, the peak being about 200 Å to 400 Å from the substrate surface;

implanting a preamorphization substance into the substrate to define an active region lower boundary, prior to activating the dopant;

activating the dopant by RTA at a temperature between about 550° C. to 650° C.; and forming a silicide on the surface of the substrate, wherein the silicide is Titanium disilicide (TiSi$_2$).

6. A method, as recited in claim 5, wherein the dopant is Arsenic.

7. A method, as recited in claim 5, wherein the preamorphization substance is a material consisting essentially of ionic Silicon or ionic Germanium.

8. A method for making a semiconductor device, comprising:

implanting a dopant into a substrate having a surface, wherein the dopant is implanted directly into the surface of the substrate by passing the dopant through only the semiconductor substrate, the dopant being implanted in an energy of about 10 KeV–20 KeV, to establish a dopant implant profile defining a peak, the peak being about 200 Å to 400 Å from the substrate surface, wherein the dopant is Arsenic;

implanting a preamorphization substance into the substrate to define an active region lower boundary, prior to activating the dopant;

activating the dopant by RTA at a temperature between about 550° C. to 650° C.; and forming a silicide on the surface of the substrate.

9. A method for making a semiconductor device, comprising:

implanting a dopant into a substrate having a surface, wherein the dopant is implanted directly into the surface of the substrate by passing the dopant through only the semiconductor substrate, the dopant being implanted in an energy of about 10 KeV–20 KeV, to establish a dopant implant profile defining a peak, the peak being about 200 Å to 400 Å from the substrate surface;

implanting a preamorphization substance into the substrate to define an active region lower boundary, prior to activating the dopant, wherein the preamorphization substance is a material consisting essentially of ionic Silicon or ionic Germanium;

activating the dopant by RTA at a temperature between about 550° C. to 650° C.; and forming a silicide on the surface of the substrate.

* * * * *